(12) United States Patent
Ruby et al.

(10) Patent No.: US 11,700,039 B2
(45) Date of Patent: Jul. 11, 2023

(54) FRONT END MODULE (FEM) WITH INTEGRATED FUNCTIONALITY

(71) Applicant: Avago Technologies International Sales Pte. Limited, Singapore (SG)

(72) Inventors: Richard Ruby, San Jose, CA (US); William Carrol Mueller, San Jose, CA (US); Young Kwon, San Jose, CA (US); Joo Min Jung, San Jose, CA (US); Chan Hoe Koo, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 17/864,099

(22) Filed: Jul. 13, 2022

(65) Prior Publication Data

US 2022/0345182 A1    Oct. 27, 2022

Related U.S. Application Data

(63) Continuation of application No. 16/913,776, filed on Jun. 26, 2020, now Pat. No. 11,394,432.

(51) Int. Cl.
*H04B 7/0413*    (2017.01)
*H03H 11/04*    (2006.01)
*H04B 1/50*    (2006.01)
*H03F 3/19*    (2006.01)

(52) U.S. Cl.
CPC ............. *H04B 7/0413* (2013.01); *H03F 3/19* (2013.01); *H03H 11/04* (2013.01); *H04B 1/50* (2013.01); *H03F 2200/294* (2013.01); *H03F 2200/451* (2013.01)

(58) Field of Classification Search
CPC ...... H04B 7/0413; H04B 1/0064; H04B 7/04; H03F 3/19; H03F 2200/294; H03F 2200/451; H03H 2009/0019
See application file for complete search history.

(56) References Cited

U.S. PATENT DOCUMENTS

| 10,236,836 | B1* | 3/2019 | Golat | H03F 3/191 |
| 2010/0022204 | A1 | 1/2010 | Rofougaran | |
| 2013/0135043 | A1 | 5/2013 | Hietala et al. | |
| 2013/0194054 | A1* | 8/2013 | Presti | H04B 1/0458 |
| | | | | 333/32 |
| 2013/0244722 | A1* | 9/2013 | Rousu | H04B 1/0057 |
| | | | | 455/552.1 |
| 2014/0001608 | A1* | 1/2014 | McPartlin | H01L 29/7378 |
| | | | | 438/420 |
| 2014/0355497 | A1* | 12/2014 | Reiha | G01S 19/13 |
| | | | | 343/745 |
| 2015/0340769 | A1 | 11/2015 | Desclos et al. | |
| 2015/0373711 | A1* | 12/2015 | Narathong | H04L 27/2601 |
| | | | | 370/280 |

(Continued)

*Primary Examiner* — Aristocratis Fotakis
(74) *Attorney, Agent, or Firm* — Foley & Lardner LLP (57) ABSTRACT

A front end radio frequency (RF) module including one or more first filter circuits configured to implement a front end function by filtering first signals communicated between one or more first antenna and a transceiver and one or more second filter circuits configured to implement at least a portion of an additional network function within the front end RF module by filtering second signals communicated between one or more second antennas and the transceiver.

20 Claims, 10 Drawing Sheets

(56) References Cited

U.S. PATENT DOCUMENTS

| | | |
|---|---|---|
| 2016/0127016 A1 | 5/2016 | Pehlke et al. |
| 2016/0241024 A1* | 8/2016 | Dupuis .................. H01L 24/49 |
| 2016/0301437 A1 | 10/2016 | Pehlke |
| 2016/0352373 A1 | 12/2016 | Wloczysiak |
| 2017/0302251 A1 | 10/2017 | Ruby et al. |
| 2018/0063031 A1 | 3/2018 | Wloczysiak et al. |
| 2018/0131501 A1 | 5/2018 | Little |
| 2018/0159563 A1 | 6/2018 | Khlat et al. |
| 2018/0294779 A1 | 10/2018 | Allen |
| 2020/0350892 A1 | 11/2020 | Yu |
| 2021/0006271 A1* | 1/2021 | Bremer ................ H05K 1/0237 |
| 2021/0058069 A1 | 2/2021 | Komatsu |
| 2021/0099137 A1 | 4/2021 | Drogi et al. |

* cited by examiner

FRONT END MODULE (FEM) WITH INTEGRATED FUNCTIONALITY

CROSS-REFERENCE TO RELATED PATENT APPLICATION

This application is a continuation of U.S. patent application Ser. No. 16/913,776 filed Jun. 26, 2020, the entirety of which is incorporated by reference herein.

BACKGROUND

The present disclosure relates generally to radio frequency (RF) systems. More particularly, the present disclosure relates to front end modules (FEMs) in RF systems. FEMs are devices that can operate between one or more transceivers and one or more antennas of an electronic device (e.g., a cell phone). The FEM can include circuits for amplifying signals, switching signals, and/or filtering signals. It may be desirable to reduce the size of the FEM such that the FEM takes up less space in a device. Furthermore, it may be desirable to decrease the number of components needed in the FEM, thus decreasing the overall cost of manufacturing the FEM. The electronic device may include a FEM for a low frequency band, a mid/high frequency band, and/or an ultrahigh frequency band. Furthermore, the electronic device may include a module for diversity, dual connectivity (DC), and/or multiple input multiple output (MIMO) functions.

SUMMARY

One implementation of the present disclosure is a front end radio frequency (RF) module including one or more first filter circuits and one or more first amplifier circuits configured to implement a front end function by filtering and then amplifying or amplifying and then filtering a first signal communicated between one or more first antenna and a transceiver and one or more second filter circuits and one or more second amplifier circuits configured to implement at least a portion of an additional network function within the front end RF module by filtering and then amplifying or amplifying and then filtering a second signal communicated between one or more second antenna and the transceiver.

In some embodiments, the additional network function is at least one of a multiple input multiple output (MIMO) function, a diversity function, and a dual connectivity (DC) function.

In some embodiments, the RF module includes one or more circuits configured to repurpose a filter circuit of the one or more first filter circuits to implement the additional network function in response to the front end RF module operating in a particular mode where the filter circuit is unused to implement the front end function.

In some embodiments, a second filter circuit of the one or more second filter circuits and the filter circuit repurposed to implement the additional network function are integrated onto a single integrated filter circuit die.

In some embodiments, at least two like filter circuits of the one or more first filter circuits and the one or more second filter circuits are integrated onto a single integrated filter circuit die.

In some embodiments, resonators of a first filter circuit of the at least two like filter circuits and a second filter circuit of the at least two like filter circuits are tiled to increase a resonator area to die area ratio of the single filter circuit die.

In some embodiments, the at least two like filter circuits are filters of a predefined frequency range and are both receive filters or transmit filters.

In some embodiments, the first filter circuit includes a first number of stages that implement filtering for the predefined frequency range and the second filter circuit includes a second number of stages that implement filtering for the predefined frequency range, wherein the first number of stages is different than the second number of stages.

In some embodiments, the at least two like filter circuits comprise a first filter circuit and a second filter circuit. In some embodiments, the single integrated filter circuit die includes a first input port and a first output port for the first filter circuit and a second input port and a second output port for the second filter circuit. In some embodiments, the first output port is connected to a first low noise amplifier (LNA) and the second output port is connected to a second LNA. In some embodiments, the first input port is connected to a first antenna and the second input port is connected to a second antenna.

In some embodiments, the single integrated filter circuit die includes one or more common ground pads for the first filter circuit and the second filter circuit.

In some embodiments, the single integrated filter circuit die includes an independent pad for each of the first input port, the first output port, the second input port, and the second output port.

Another implementation of the present disclosure is an electronic device including a front end radio frequency (RF) module comprising filter circuits and amplifier circuits configured to implement a front end function by filtering and then amplifying or amplifying and then filtering a signal communicated between one or more antenna and a transceiver. At least two filter circuits of the filter circuits are integrated onto a single integrated filter circuit die of the RF module, wherein the at least two filter circuits are associated with a predefined frequency range.

In some embodiments, the RF module of the electronic device includes one or more second filter circuits and one or more second amplifier circuits configured to implement at least a portion of an additional network function within the front end RF module by filtering and then amplifying or amplifying and then filtering a second signal communicated between one or more second antenna and the transceiver. In some embodiments, the additional network function is at least one of a multiple input multiple output (MIMO) function, a diversity function, and a dual connectivity (DC) function.

In some embodiments, the RF module of the electronic device includes one or more circuits configured to repurpose a filter circuit of the plurality of filter circuits to implement the additional network function in response to the front end RF module operating in a particular mode where the filter circuit is unused to implement the front end function.

In some embodiments, a second filter circuit of the one or more second filter circuits and the filter circuit repurposed to implement the additional network function are integrated onto a particular single integrated filter circuit die of the RF module of the electronic device.

In some embodiments, at least two like filter circuits of the plurality of filter circuits and the one or more second filter circuits are integrated onto a particular single integrated filter circuit die of the RF module of the electronic device. In some embodiments, one or more of a plurality of resonators of a first filter circuit of the two like filter circuits and a second filter circuit of the two like filter circuits are tiled to increase a resonator area to die area ratio of the particular single integrated filter circuit die. In some embodiments, the at least two like filter circuits are both receive filters or transmit filters.

In some embodiments, the particular single integrated filter circuit die includes a first input port and a first output port for the first filter circuit and a second input port and a second output port for the second filter circuit. In some embodiments, the first output port is connected to a first low noise amplifier (LNA) and the second output port is connected to a second LNA. In some embodiments, the first input port is connected to a first antenna and the second input port is connected to a second antenna.

Another implementation of the present disclosure is a multi-chip module device including integrated filter circuits, integrated switch circuits, and integrated amplifier circuits configured to implement a front end function by filtering and then amplifying or amplifying and then filtering a signal communicated between one or more first antenna and a transceiver. At least two filter circuits of the filter circuits are integrated onto a single integrated filter circuit die of the device, wherein the two filter circuits are associated with a predefined frequency range. One or more die infrastructure of the single integrated filter circuit die are shared between the at least two filter circuits.

In some embodiments, two or more of the integrated amplifier circuits are integrated onto a single integrated amplifier circuit die.

In some embodiments, two or more of the integrated switch circuits of the multi-chip module device are integrated onto a single integrated switch circuit die of the multi-chip module and additional logic for a Mobile Industry Processor Interface (MIPI) controller of the multi-chip module is integrated together with the MIPI controller on a single integrated MIPI controller circuit die.

DETAILED DESCRIPTION

Referring generally to the FIGURES, an example FEM with integrated functionality is shown. In some embodiments, a FEM can be configured to absorb the functionality of other modules such as a diversity module, a MIMO module, and/or a Dual Connectivity (DC) module. A MIMO module can be a device of an electronic system that multiplies the capacity of a radio link using multiple transmitting and receiving antennas to exploit multipath propagation. A diversity module can be a device of the electronic system that improves a communication link quality by utilizing two or more communication channels. A DC module can perform operations to facilitate dual connectivity with small cell networks and macro cell networks. The FEM can integrate the components (e.g., filters, amplifiers, etc.) of an additional network functionality (e.g., MIMO, DC, diversity) with the components (e.g., filters, amplifiers, etc.) of the FEM.

In some cases, adding additional components to a FEM causes the FEM to become large. To reduce the size of the FEM, in some embodiments, additional switches and LNAs can be integrated onto the silicon integrated circuits (ICs) of a FEM that already include switches and LNAs. Furthermore, like filters can be combined at the die level within the FEM. Like filters can be filters that support substantially the same frequency band and are a same type (e.g., a transmitting filter, a receiving filter, a bandpass filter, etc.). Like filter integration can enable the addition of functionality (e.g., absorbing MIMO, diversity, or DC functionality) into a FEM with little or no increase in the module size.

In some embodiments, two or more instances of filters of a FEM supporting a particular frequency range, e.g., a frequency band, can be integrated onto a single die. In some embodiments, the integrated filters include a filter of a FEM and another filter of an additional network function (e.g., MIMO, diversity, DC, etc.). This integration allows reduction of board area at the system level while increasing FEM functionality. Furthermore, integrating like filters onto a single die results in increased area efficiency without impacting wafer yield. The number of die per wafer may be reduced as the die grows to accommodate the added filters but this can be avoided by integration techniques.

Some FEMs include multiple filters of the same frequency band, each configured to operate to meet communication requirements of different geographic regions. For example, one filter may be applicable for wireless communication in a first geographic area while another filter, of the same frequency band, can be implemented within the FEM to facilitate communication in a second geographic area. Integration of these like filter functions onto a single die of the FEM can provide area savings and reduce materials required for the FEM.

For example, there may be two Band 41 (B41) filter instances in a FEM, one used in an Asia switch configuration, the other in a North America switch configuration. If the FEM also supports MIMO for operation in North America, the B41 filter instance used in the Asia configuration might be repurposed as a B41 filter for MIMO in North America operation, i.e., when a device including the FEM is located in North America. Similarly for operation in Asia, the instance of the B41 filter in the North American configuration might be operated as the MIMO filter for Asia operation. Thus, only two filters are needed instead of three.

Integrating like filters can be used to absorb external filters for a MIMO circuit, diversity circuit, and/or a DC circuit into the FEM without the FEM increasing significantly in size. Integrating MIMO circuits, DC circuits, and/or diversity circuits can eliminate entire external modules and create significant efficiencies. Furthermore, integrating like filters can ease repurposing of extra instances of filters (e.g., from geographical combinations) to other uses like MIMO, diversity, or DC.

Another benefit of like filter integration is that overall wafer yield can remain constant as processes, process flows, and order-of-masks are unchanged. Generally, the larger the integrated die, the fewer total die per wafer. However, this decrease in die yield can be mitigated through the filter integration by sharing grounds, tiling (e.g., efficiently matching larger resonators with small resonators), eliminating redundant saw alleys and/or streets, eliminating redundant keep out zones, and/or other techniques. For example, infrastructure of a filter such as saw streets and keep out zones that surround every die for assembly purposes. However, saw streets and keep out zones can be shared when multiple filters occupy a single die, thus resulting in area savings for the die. Other space saving techniques such as the sharing of ground pins between the filters integrated onto the die can also be implemented.

Figure 1:
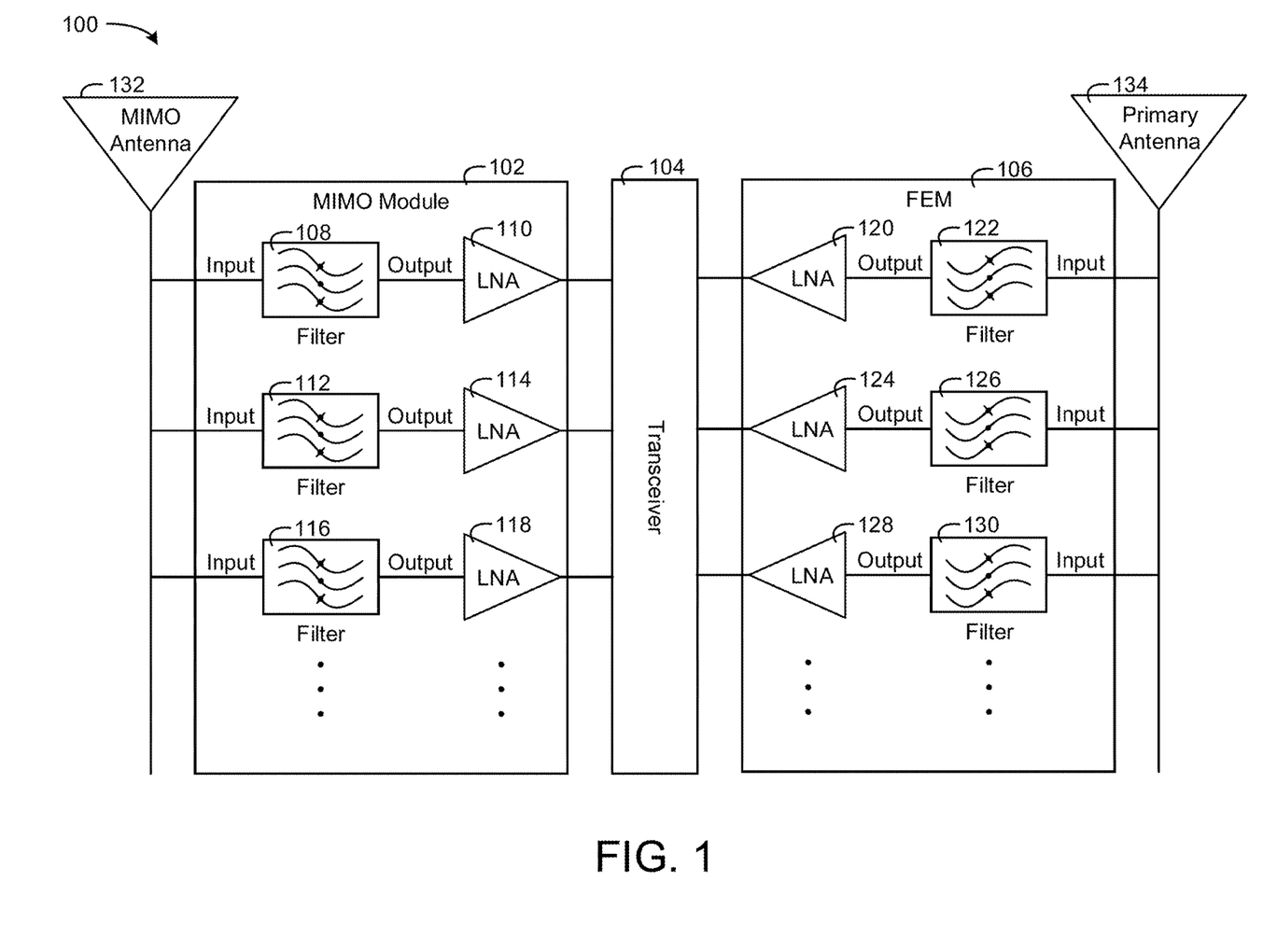
FIG. 1 shows an example system including a FEM and a multiple input multiple output (MIMO) module, where the FEM and the MIMO module are separate modules that interface between antennas and a transceiver.

Referring now to FIG. 1, an example system 100 including a FEM 106 and a MIMO module 102, where the FEM 106 and the MIMO module 102 are separate modules that interface between antennas 132-134 and a transceiver 104. The FEM 106 and/or the MIMO module 102 can include various duplexers, diplexers, triplexers, quadplexers, etc. The system 100 can be any kind of wirelessly communicating device. For example, the system 100 can be a cell phone, a laptop, a tablet, a wireless router, an Internet of Things (IoT) device, a set top box, and/or any other type of wirelessly communicating device.

The system 100 can include one or multiple antenna. In FIG. 1, the system 100 includes a MIMO antenna 132 and a primary antenna 134. The MIMO antenna 132 and/or the primary antenna 134 can be isotropic antennas, dipole antennas, monopole antennas, array antennas, loop antennas, conical antennas, and/or any other type of antenna. The MIMO module 102 and/or the FEM 106 can be configured to perform filtering and/or amplifying for receiving signals via the MIMO antenna 132 and/or the primary antenna 134 (shown) and/or perform filtering and/or amplifying for transmitting signals received from the transceiver 104 via the MIMO antenna 132 and/or the primary antenna 134 (not shown).

The FEM 106 can include filters 122-130 each configured to receive a signal from the primary antenna 134 and filter the received signal. The filters 122-130 are shown as band pass filters but can be low pass filters, high pass filters, and/or any other type of filter. Low noise amplifiers (LNAs), i.e., LNAs 120-128 can be configured to amplify the filtered signals before providing the amplified signals to the transceiver 104. While only three sets of LNAs and filters are shown in the FEM 106, any number of sets of LNAs and filters can be included within the FEM 106 for transmitting signals and/or receiving signals.

The MIMO module 102 can include filters 108-116 each configured to receive a signal from the MIMO antenna 132 and filter the received signal. The filters 108-116 are shown as band pass filters but can be low pass filters, high pass filters, and/or any other type of filter. The filters 108-116 can be filters for Band 25, Band 34, Band 39, Band 42, and/or any other frequency band or predefined range of frequencies. LNAs 110-118 can be configured to amplify the filtered signals before providing the amplified signals to the transceiver 104. While only three sets of LNAs and filters are shown in the MIMO module 102, any number of sets of LNAs and filters can be included within the MIMO module 102 for transmitting signals and/or receiving signals.

The transceiver 104 can include one or more components for processing received signals and/or signals to be transmitted. The transceiver 104 can include various mixers, filters, oscillators, phase shifters, etc. Furthermore, the transceiver 104 can include one or more analog to digital converters (ADC) and/or digital to analog converters (DACs). The transceiver 104 can interface with another device and/or component of the system 100, e.g., a processing system of the system 100.

While the system 100 is shown to include a MIMO module 102, the system can instead, or additionally, include a module to handle another network function. While the MIMO module 102 handles filtering and/or amplification for a MIMO network function, in some embodiments, the system 100 can include components to implement a DC network function or a diversity network function.

Figure 2:
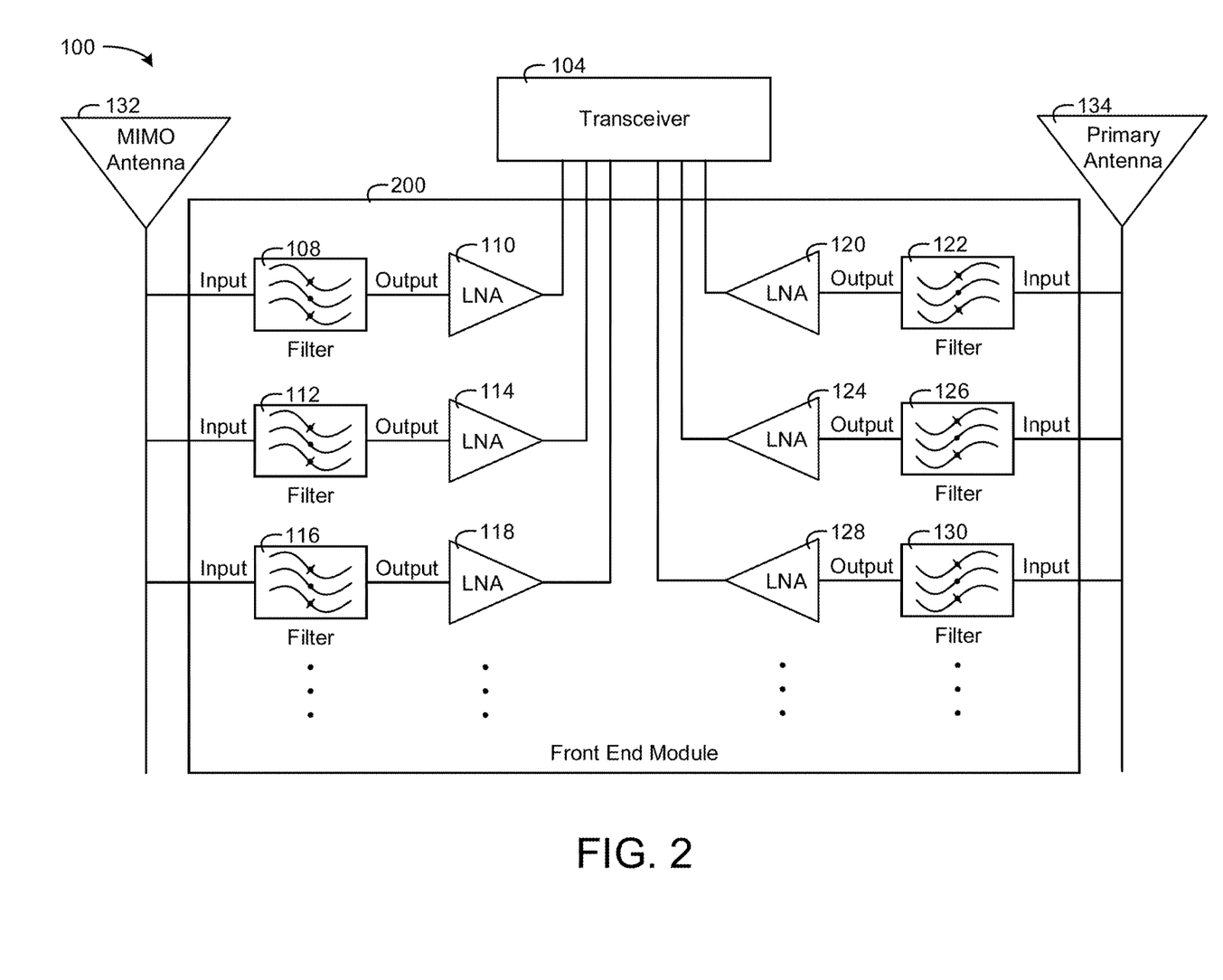
FIG. 2 shows an example system including a FEM that integrates the FEM and the MIMO module of FIG. 1 into a single FEM.

Referring now to FIG. 2, the system 100 including a FEM 200 that integrates the FEM 106 and the MIMO module 102 into a single module is shown. The FEM 200 includes one or more circuit dies that integrate the filters 108-130 and/or the LNAs 110-128. Switching, amplification, and/or control circuit components of the MIMO module 102 and the FEM 106 can be integrated together in the FEM 200. The integration may maintain a high degree of isolation between transmitting and/or receiving MIMO and/or FEM paths.

While the FEM 200 is shown to integrate the MIMO module 102 with the FEM 106, in some embodiments, the FEM 200 can integrate a MIMO module, a diversity module, and/or a DC module into the FEM 200. In this regard, filters and/or amplifiers of one or more network functions can be integrated along with the filters and/or amplifiers of a FEM.

In some embodiments, any filter that in a particular mode of operation of the system 100 is not being used in the primary path of the FEM 200 can be re-purposed to support MIMO, diversity, and/or DC functions. In some embodiments, integration of MIMO, DC, and/or diversity functionality into the FEM 200 enables filter reuse. Any filter that in a particular mode of operation is not used in the primary FEM path can be re-purposed to support MIMO, diversity, and/or dual connectivity functions. In some embodiments, these separate filters used to support the same band can be integrated onto a single die.

Figure 3:
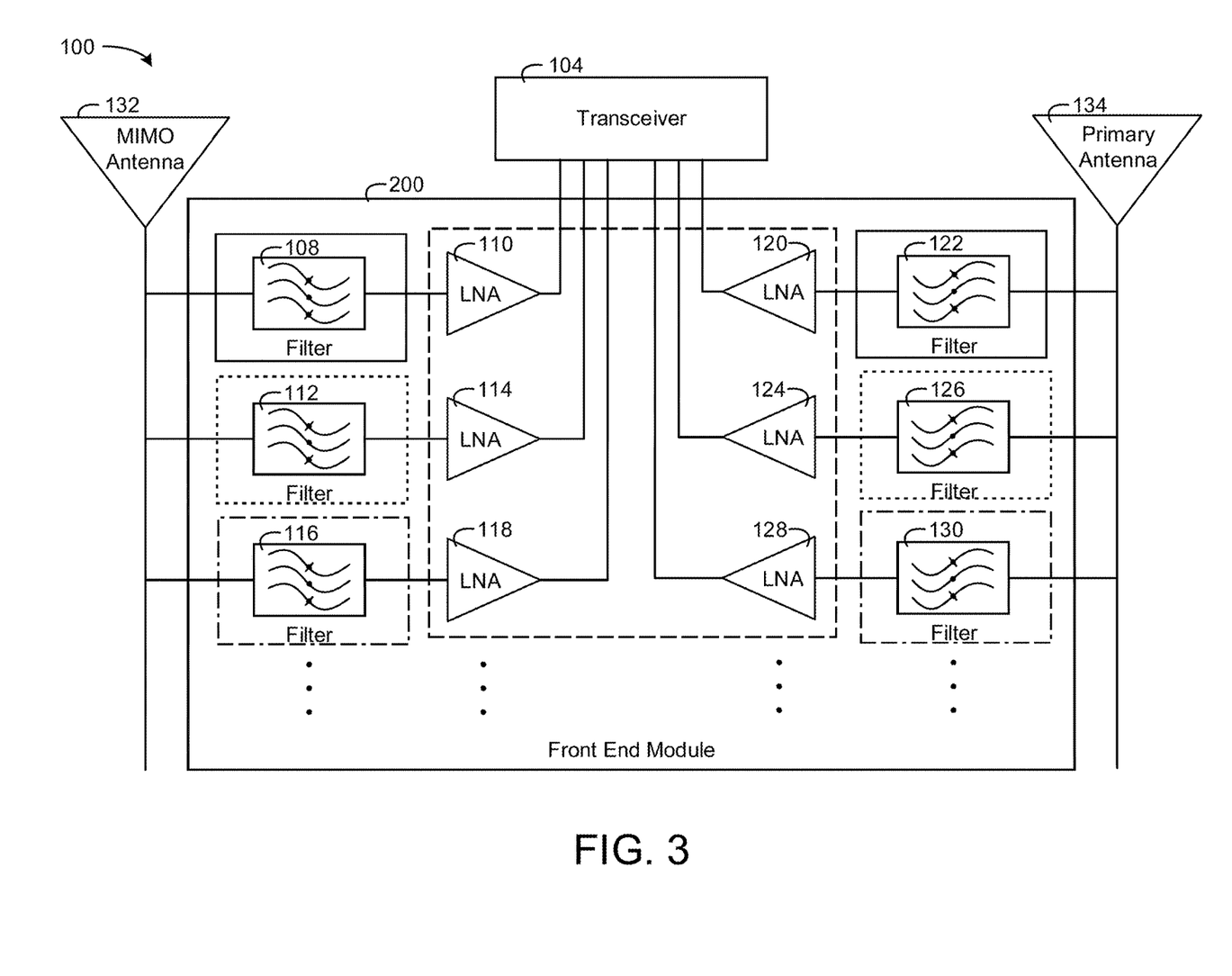
FIG. 3 shows an example system including a FEM that integrates like filters onto integrated filter circuit dies and integrates low noise amplifiers onto a single integrated amplifier circuit die.
Figure 4:
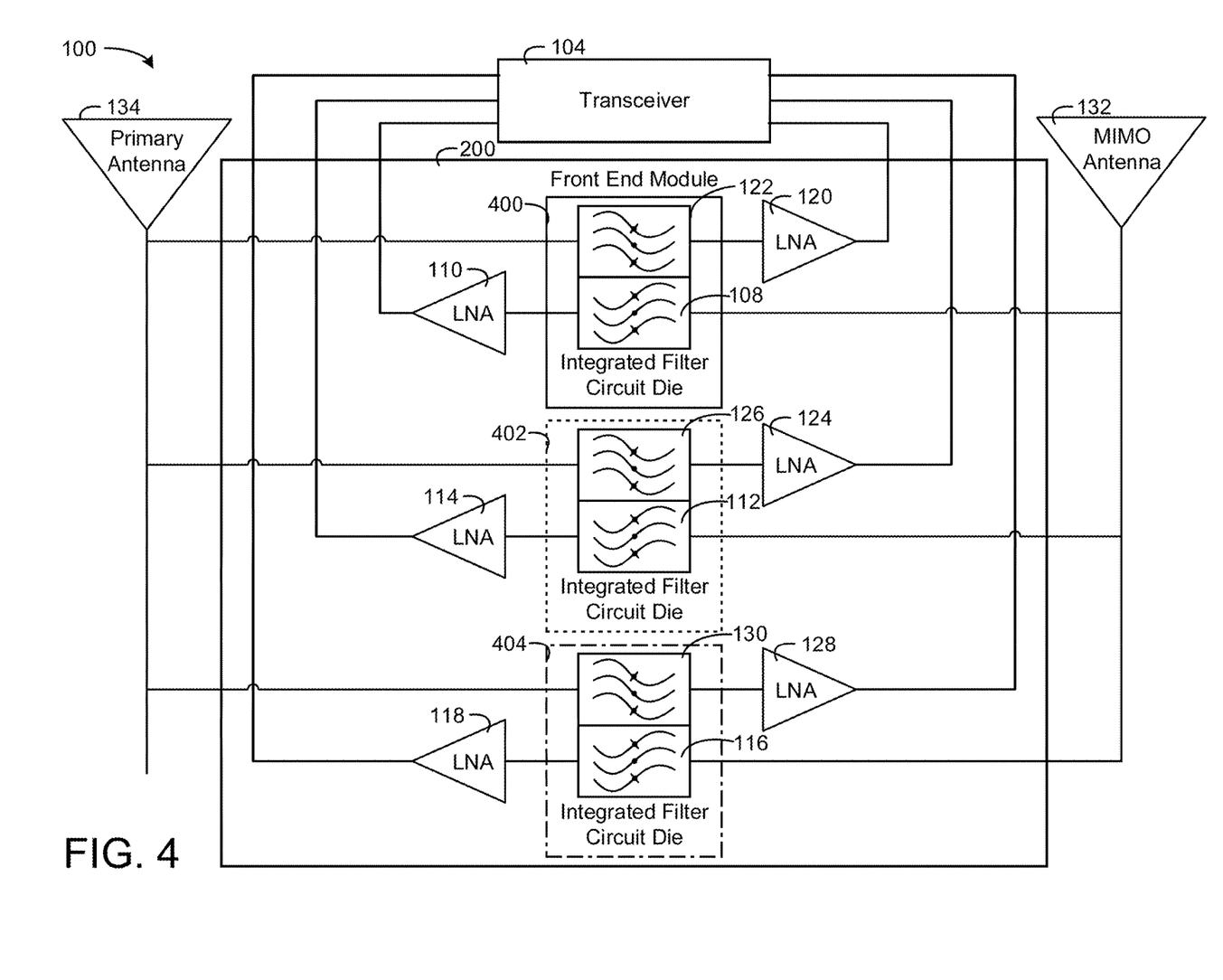
FIG. 4 shows an example system including a FEM that integrates like filters onto integrated filter circuit dies.

Referring now to FIGS. 3-4, the system 100 including the FEM 200 that integrates like filters onto integrated filter circuit dies and integrates low noise amplifiers onto a single integrated amplifier circuit die is shown. In some embodiments, the LNAs 110-128 can be integrated together on a single integrated LNA circuit die. In this regard, the amplification for the FEM 200 and/or a MIMO function (or another network function such as diversity and/or DC), can be integrated onto a single integrated amplifier circuit die.

Furthermore, the filter 108 can be integrated with the filter 122 on an integrated filter circuit die 400, the filter 112 can be integrated with the filter 126 on another integrated filter circuit die 402, and/or the filter 116 can be integrated with the filter 130 on another integrated filter circuit die 404. In this regard, MIMO filters (or filters of another network function such as diversity and/or DC) can be integrated with filters of the FEM.

In some embodiments, the filters 108-116 and/or the filters 122-130 are grouped and integrated onto dies based on a predefined frequency range. The predefined frequency range could be a RF band, e.g., Band 25, Band 34, Band 39, Band 41, Band 42. For example, two or more filters of the MIMO module 102 and/or FEM 106 that are associated with a particular frequency range can be integrated together onto a particular integrated filter circuit die.

In some embodiments, switches can be integrated onto a single integrated switch circuit die. In some embodiments, components to implement a MIPI controller (e.g., additional MIPI logic and a MIPI controller) can be integrated onto a single integrated MIPI controller circuit die. In some embodiments, multiple amplifiers can be integrated onto a single integrated amplifier circuit die. LNAs on silicon substrates can be integrated with other LNA circuits on silicon substrates. Switches on Silicon on Insulator (SOI) can be integrated onto single SOI silicon die, growing the die slightly.

In some embodiments, filters for MIMO can be integrated with filters of the FEM that are like filters, e.g., filters that support the same frequency band. Furthermore, based on a switching configuration of the FEM 200, filters can be repurposed to implement various network functions, hence, reducing an overall filter count. For example, filters associated with a specific geographic region that the system 100 is not located in (e.g., filters for a North America mode of operation) could be repurposed by one or more switches of the FEM 200 to implement MIMO, DC, and/or diversity for the system 100.

In FIG. 4, only two filters are implemented on each of the integrated filter circuit dies 400-404. In some embodiments, any number of filters can be integrated onto the same integrated filter circuit die. For example, three, four, or more like filters could be integrated onto the same integrated filter circuit die. For example, a filter of a FEM, a filter of a MIMO module, a filter of a DC module, and/or a filter of a diversity module could be integrated onto a single integrated filter circuit die where each of the filters is associated with a particular frequency band.

Figure 5:
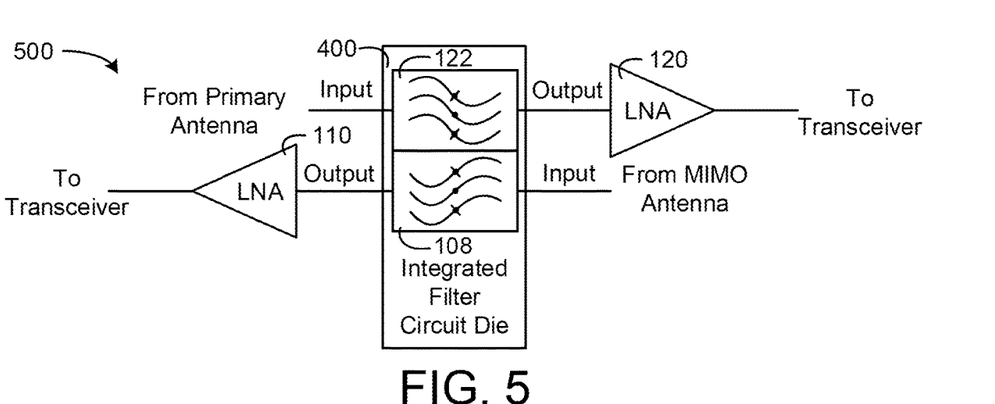
FIG. 5 shows an example circuit of multiple like filters integrated onto a single integrated filter circuit die and separate LNAs.

Referring now to FIG. 5, a circuit 500 including the integrated filter circuit die 400 that integrates multiple like filters and separate LNAs 110 and 120 is shown. The integrated filter circuit die 400 includes two or more sets of input and output ports that are independent of each other. Furthermore, the input and output ports are not connected to the same antenna, but are instead connected to separate antennas, the primary antenna 134 and the MIMO antenna 132 respectively.

Furthermore, the output ports of the integrated filter circuit die 400 are not connected to the same LNA but are instead connected to separate LNAs, i.e., the LNA 120 and the LNA 110 respectively. One filter on the integrated filter circuit die 400 can be used as the primary filter for the FEM (e.g., the filter 122) and a different filter on the integrated filter circuit die 400 supporting the same frequency band can be used for a MIMO, diversity, or DC network function (e.g., the filter 108).

By combining like filters onto the same integrated filter circuit die 400, the space on the die can be used more efficiently. For example, saw alleys take up a proportionally smaller percent of the area for an integrated filter circuit die that includes more integrated filters. In many cases, the filter size is dictated by the minimum spacing of the pads and the vias of the integrated filter circuit die. By adding more functional resonators to form another like filter, but sharing the grounds with the other filter of the integrated filter circuit die 400, the efficiency of pad uses increases.

Distance spacing between resonators and other infrastructure (e.g., ground seals, via pads, etc.) and tiling resonators (e.g., matching small with large resonators to optimize space) contributes to making the net filter area smaller. In a module, every filter needs a keep out zone to allow for the placing of the filters during assembly. This keep out zone and dead space is minimized when integrating multiple filters on the same die.

Figure 6:
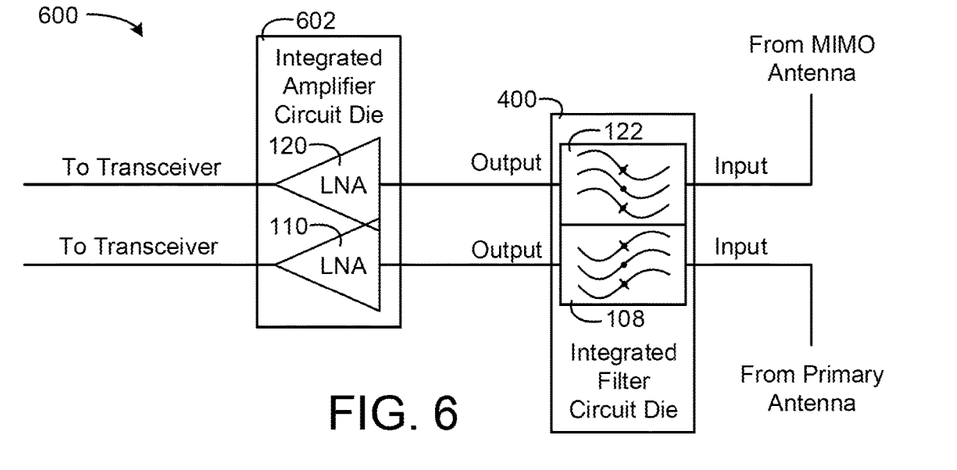
FIG. 6 shows an example circuit of multiple like filters integrated onto a single integrated filter circuit die and multiple LNAs integrated onto another single integrated amplifier circuit die.

Referring now to FIG. 6, a circuit 600 of multiple like filters integrated onto the single integrated filter circuit die 400 and multiple LNAs integrated onto an integrated filter circuit die 602 is shown. One input port of the integrated amplifier circuit die 602 connects to an output port of the integrated circuit filter die 400 associated with the filter 122. Another input port of the integrated amplifier circuit die 602 connects to an output port of the integrated filter circuit die 400 associated with the filter 108. Output ports of the integrated amplifier circuit die 602 associated with the LNA 120 and the LNA 110 can both connect to the transceiver 104.

Figure 7:
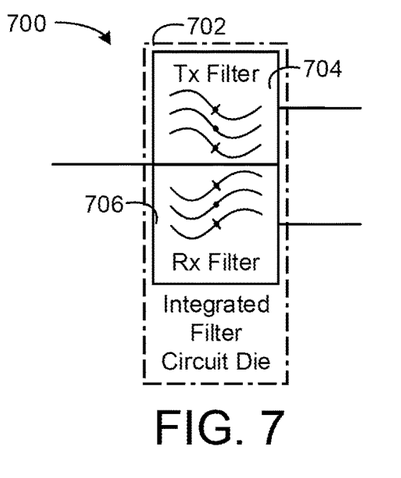
FIG. 7 shows an example circuit of a transmitter (Tx) filter and a receiver (Rx) filter integrated onto a single die.

Referring now to FIG. 7, a circuit 700 of a transmitter (Tx) filter 704 and a receiver (Rx) filter 706 integrated onto a single die 702 is shown. As compared to the integrated filter circuit die 400 illustrated in FIGS. 5 and 6, the integrated amplifier circuit die 702 integrates Tx and Rx filters while the integrated filter circuit die 400 integrates two like filters, two Rx filters. Furthermore, the integrated filter circuit die 702 includes three ports as compared to the four ports of the integrated filter circuit die 400. The integrated filter circuit die 400 includes separate input and output ports for each of the filters 122 and the 108. In comparison, the integrated filter circuit die 702 includes separate output ports and a common input port for the Tx filter 702 and the Rx filter 706 of the integrated filter circuit die 702.

Figure 8:
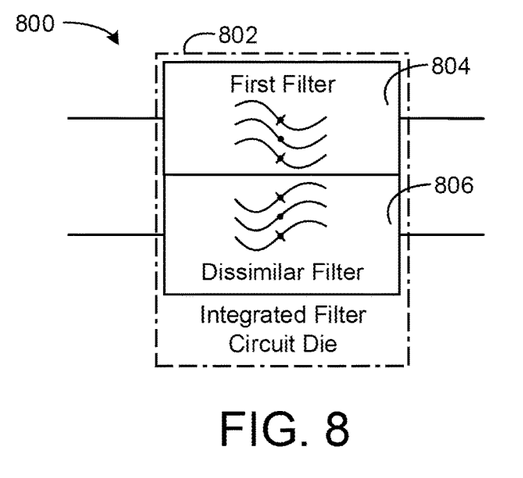
FIG. 8 shows an example circuit of two dissimilar filters integrated onto a single die.

Referring now to FIG. 8, a circuit 800 of two dissimilar filters integrated onto the integrated filter circuit die 802 is shown. In comparison to the integrated filter circuit die 400 that integrates two similar filters, the filters of the integrated filter circuit die 802 are dissimilar. First filter 804 and dissimilar filter 806 of the integrated filter circuit die 802 can each serve a separate frequency band. For example, the first filter 804 can serve a Band 34 while the dissimilar filter 806 can serve a spate frequency band, e.g., Band 39.

Dissimilar filters may be filters that serve separate frequency ranges and/or serve a different purpose within a FEM, e.g., a filter for filtering a transmit signal and a filter for filtering a received signal. Similar or like filters may be filters that serve the same frequency range (e.g., pass a predefined frequency range) or both serve the same purpose within a FEM, e.g., both filter transmit signals or both filter receive signals.

Figure 9:
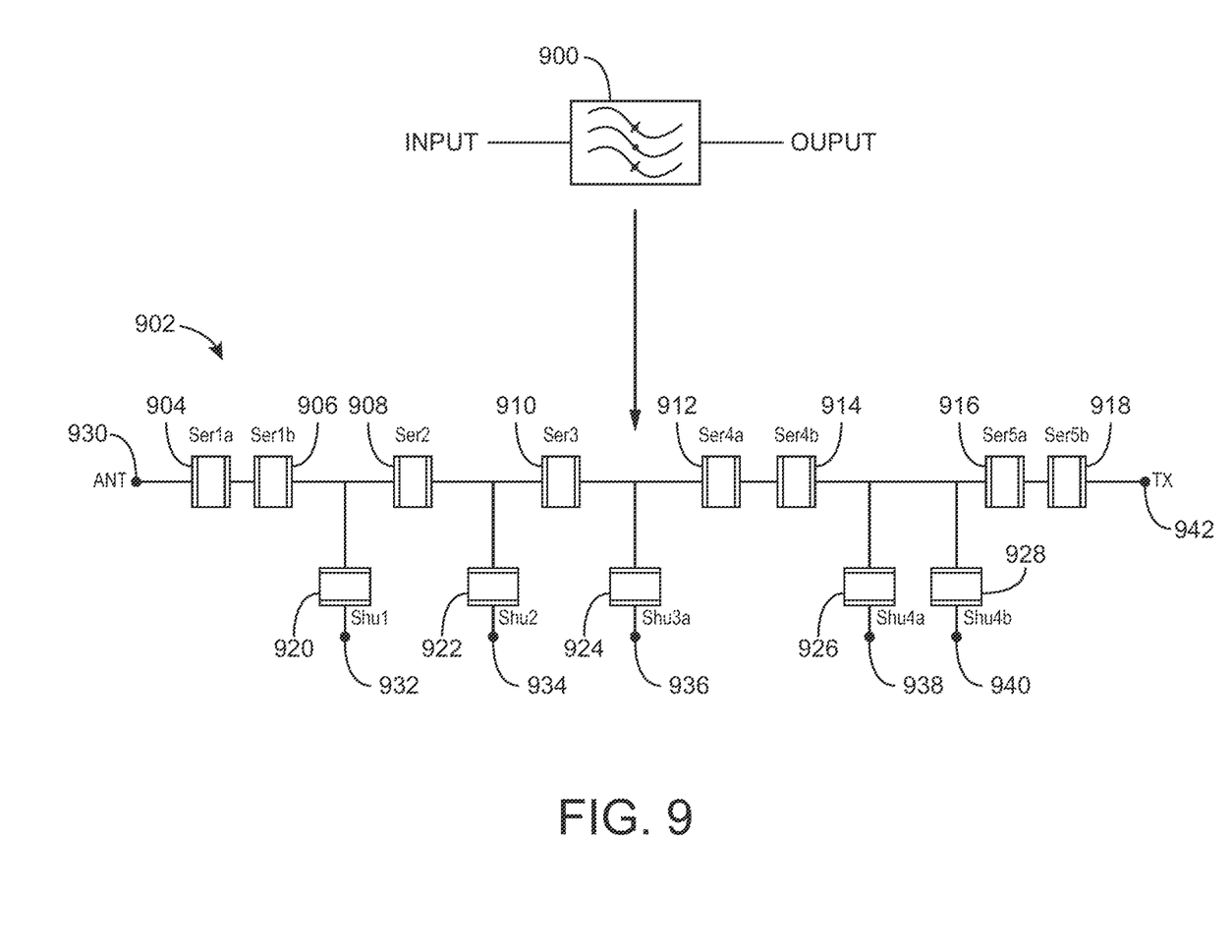
FIG. 9 shows an example circuit diagram of resonators for a filter circuit.

Referring now to FIG. 9, circuit 902 of resonators for a filter circuit 900 is shown. The circuit 902 can be a resonator based band pass filter. The circuit 902 includes series resonators 904-918 and shunt resonators 920-928. The resonators 904-928 can be bulk acoustic wave (BAW) resonators, thin film bulk acoustic wave resonator (FBAR), solidly mounted resonator (SMR), and/or any other type of resonator. The circuit 902 includes an input port pad 930 and an output port pad 942. The circuit 902 includes ground pads 932-940.

Figure 10:
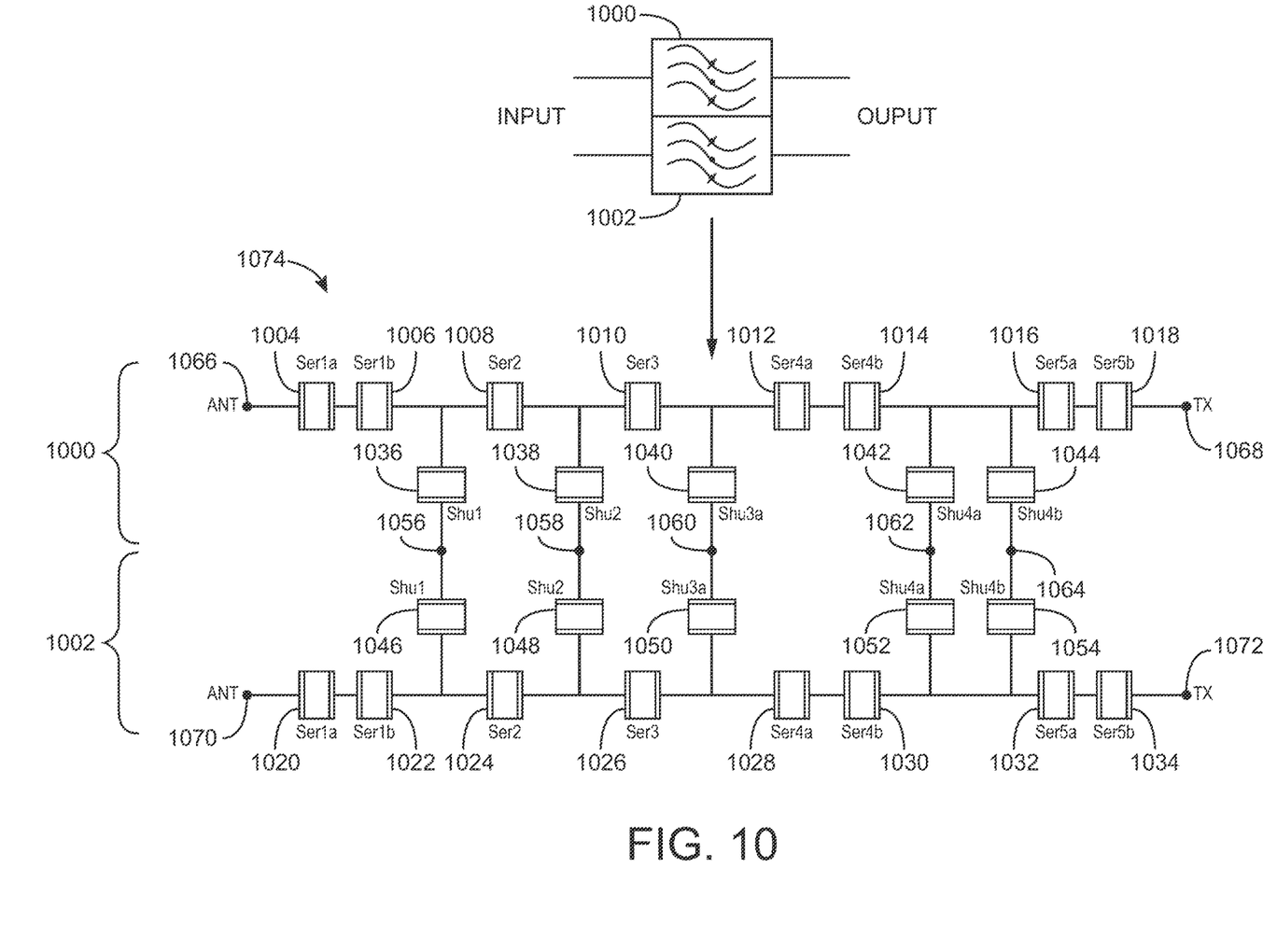
FIG. 10 shows an example circuit diagram of resonators for two filters integrated onto a single die.

Referring now to FIG. 10, a circuit 1074 of resonators for two filters 1000 and 1002 integrated onto a single integrated filter circuit die is shown. The filter 1000 and the filter 1002 include the same filter design and each include the same number and configuration of resonators. The resonators 1004-1054 can be BAW resonators, FBARs, SMRs, and/or any other type of resonator. The resonators 1004-1054 can be located on a surface of an integrated filter circuit die. The filter 1000 includes series resonators 1004-1018 and shunt resonators 1036-1044. The filter 1002 includes series resonators 1020-1034 and shunt resonators 1046-1054.

The circuit 1074 includes shared ground pads 1056-1064 between the two filters 1000 and 1002. The ground pads 1056-1064 can interconnect the die to a printed circuit board (PCB). Furthermore, the circuit 1074 includes a pad 1066 to connect the filter 1000 to an antenna. The circuit 1074 includes a pad 1068 to connect the filter 1000 to another component (e.g., a transceiver, an amplifier, etc.). Furthermore, the circuit 1074 includes a pad 1070 to connect the filter 1002 to an antenna. The circuit 1074 includes a pad 1072 to connect the filter 1002 to another component (e.g., a transceiver, an amplifier, etc.).

Figure 11:
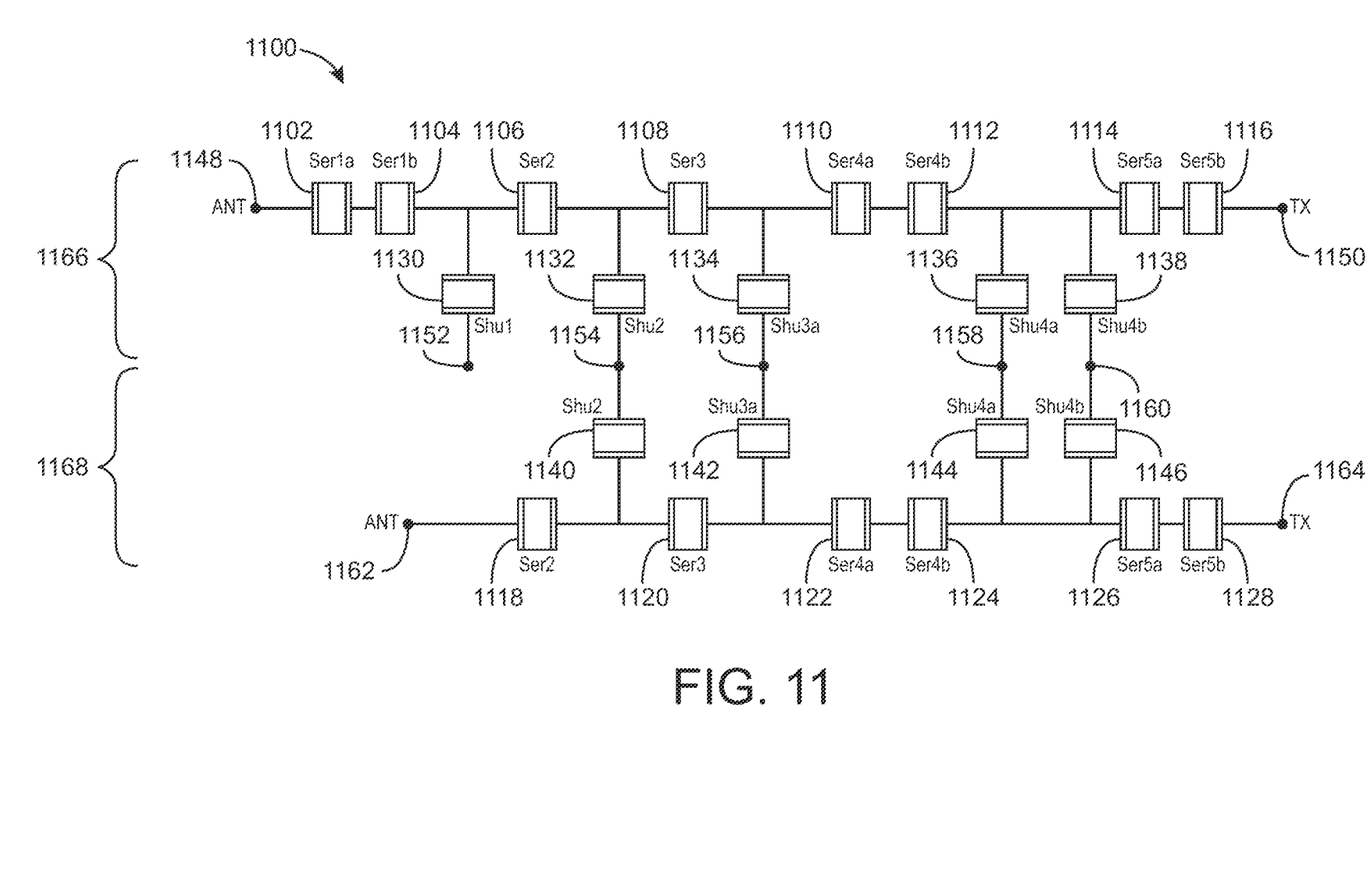
FIG. 11 shows an example circuit diagram of resonators for two filters integrated onto a single die with different numbers of stages.

Referring now to FIG. 11, a circuit 1100 of resonators for two filters integrated onto a single integrated filter circuit die with varying stages is shown. The circuit 1100 can implement filters 1166 and 1168, which may be like filters, filters supporting the same frequency range. However, the filters 1166 and 1168 can be implemented with different numbers of stages. The filters 1166 and 1168 may have various numbers of stages based on the varied number of stages needed for MIMO filters and FEM filters.

The circuit 1100 includes resonators 1102-1146. The resonators 1102-1146 can be BAW resonators, FBARs, SMRs, and/or any other type of resonator. The filter 1166 can include series resonators 1102-1116 and shunt resonators 1130-1138. The filter 1168 includes series resonators 1118-1128 and shunt resonators 1140-1146. The filter 1166 includes a pad 1148 for connecting with an antenna and a pad 1150 for connecting with another component (e.g., a transceiver or amplifier). The filter 1168 includes a pad 1162 for connecting to an antenna and a pad 1164 for connecting to another component (e.g., a transceiver or amplifier). The filters 1166 and 1168 share ground pads 1154-1160. The filter 1166 includes a ground pad 1152.

Figure 12:
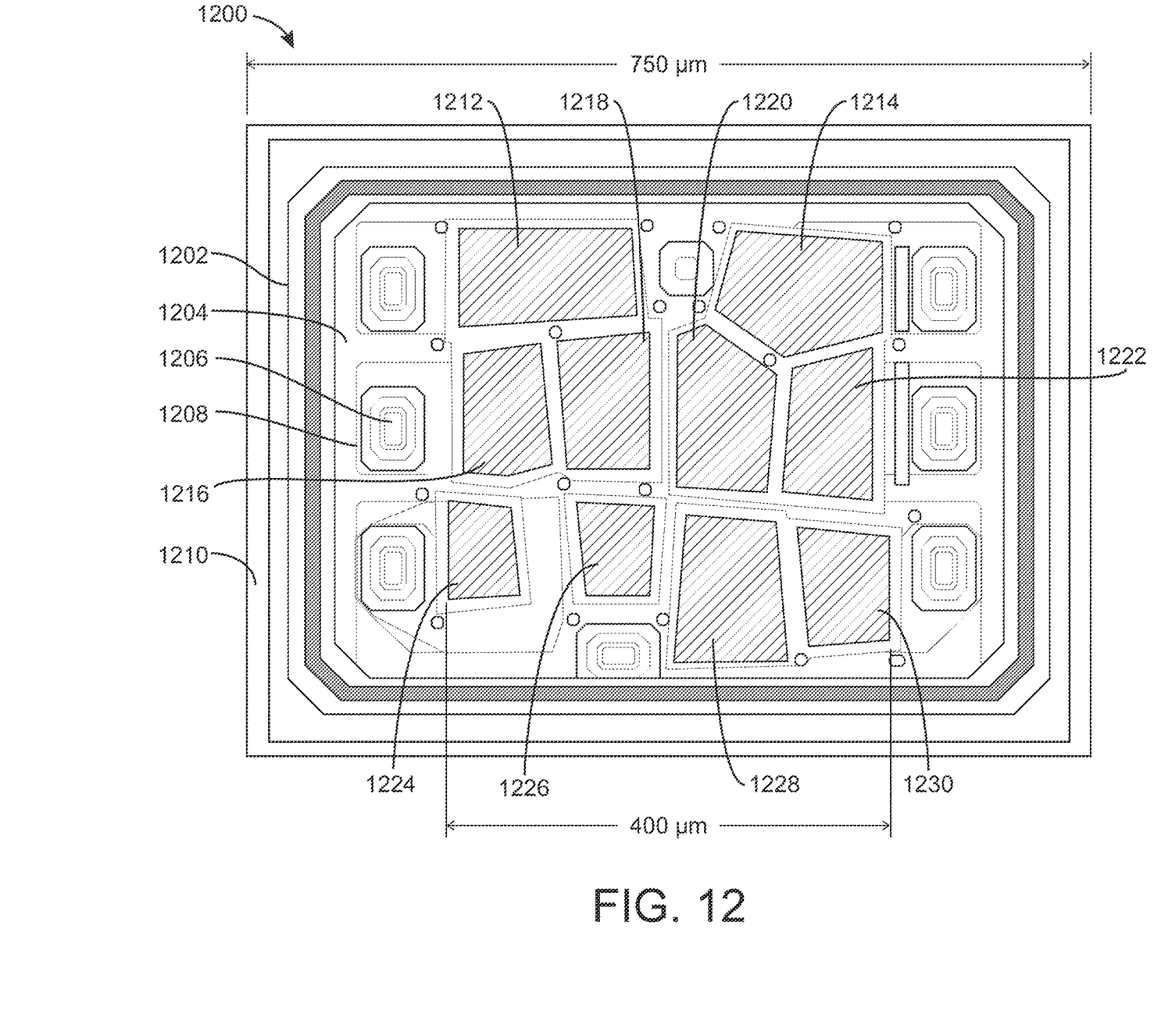
FIG. 12 shows an example layout of a Band 25 filter circuit die.

Referring now to FIG. 12, a layout of an circuit die 1200 of a Band 25 receive filter is shown. The integrated circuit die 1200 is a 750 micrometer (um) by 570 um die. The circuit die 1200 making up the resonator itself is approximately 400 um by 385 um. The resonator area to die area of the circuit die 1200 is approximately 36%. The integrated circuit die 1200 includes infrastructure, i.e., seal rings 1202, vias 1204, landing sites 1206 around the vias 1204, keep out areas 1208, saw streets 1210, and metal interconnects between resonators 1212-1230. The packing of the resonators 1212-1230 may be efficient but the infrastructures can take up space.

Figure 13:
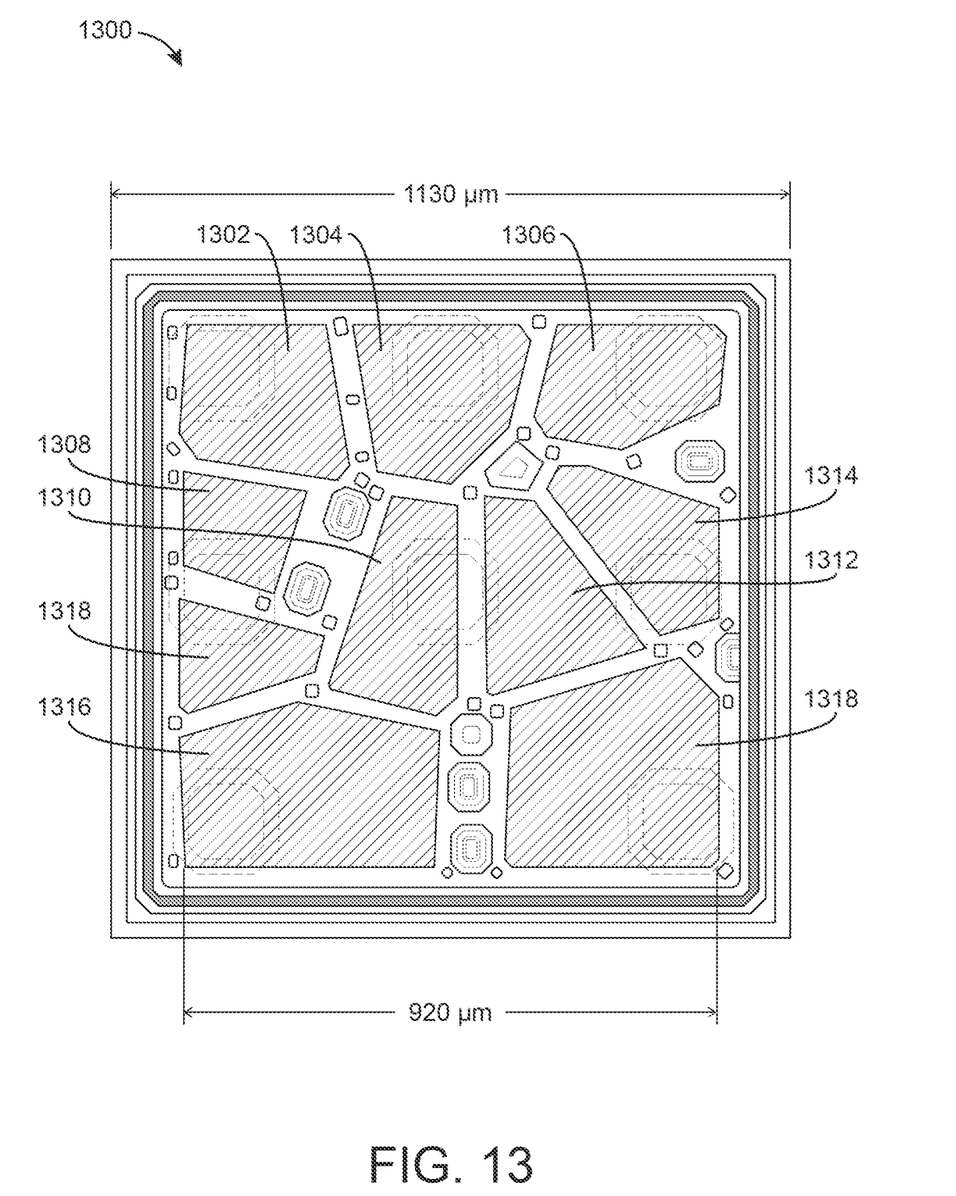
FIG. 13 shows an example layout of a Band 8 duplexer circuit die.

Referring now to FIG. 13, an example layout of a Band 8 duplexer integrated circuit die 1300 is shown. The circuit die 1300 includes like integrated filters. Resonators 1302-1318 of the circuit die 1300 are tiled to minimize die area. The circuit die 1300 is 1130 um by 1130 um. The resonator area of the circuit die 1300 is approximately 920 um by 924 um. The resonator area to die area is 67%.

In FIG. 13, multiple mask layers are shown. Each layer includes a material (e.g., the bottom electrode metal, the piezo layer, etc.) that has a specific thickness. Thus the unit process tool used to deposit or etch a layer deals with a unique thickness (e.g., dep time and etch time) and although the patterns and shapes can change, the unit process tools and the order with which the process flows from start to finish are identical for layers of like filters. Because each of the resonators for a filter has the same acoustic stack for the counterpart resonator of the like filter, the frequency spectrum that the two filters address is the same.

The circuit design hardware system may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLO), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HOD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

Various implementations have been specifically described. However, many other implementations are also possible.

What is claimed:

1. A radio frequency (RF) module comprising:
one or more first filter circuits of a bandwidth and one or more first amplifier circuits configured to implement a first function in a first geographic region by filtering and then amplifying or amplifying and then filtering a first signal communicated between one or more first antennas and a transceiver; and one or more second filter circuits of the bandwidth and one or more second amplifier circuits configured to implement a second function in a second geographic region by filtering and then amplifying or amplifying and then filtering a second signal communicated between one or more second antennas and the transceiver;

wherein the one or more first filter circuits and the one or more second filter circuits are integrated on a single integrated filter circuit die and the RF module is configured to repurpose the one or more first filter circuits to implement an additional network function responsive to a signal, the signal generated responsive to a determination to operate the RF module for the second geographic region.

2. The RF module of claim 1, wherein the additional network function is at least one of a multiple input multiple output (MIMO) function, a diversity function, and a dual connectivity (DC) function.

3. The RF module of claim 1, wherein a plurality of resonators of a first filter circuit of the one or more first filter circuits and a second filter circuit of the one or more second filter circuits are tiled to increase a resonator area to die area ratio of the single integrated filter circuit die.

4. The RF module of claim 1, wherein the RF module is configured to repurpose the one or more first filter circuits to implement the additional network function in response to the RF module operating in a particular mode where the one or more first filter circuits are unused to implement the first function.

5. The RF module of claim 1, wherein at least two like filter circuits of the one or more first filter circuits and the one or more second filter circuits are integrated onto the single integrated filter circuit die.

6. The RF module of claim 5, wherein a plurality of resonators of a first filter circuit of the at least two like filter circuits and a second filter circuit of the at least two like filter circuits are tiled to increase a resonator area to die area ratio of the single integrated filter circuit die.

7. The RF module of claim 6, wherein the at least two like filter circuits are filters of a predefined frequency range and are both receive filters or transmit filters.

8. The RF module of claim 7, wherein the first filter circuit includes a first number of stages that implement filtering for the predefined frequency range and the second filter circuit includes a second number of stages that implement filtering for the predefined frequency range, wherein the first number of stages is different than the second number of stages.

9. The RF module of claim 5, wherein the at least two like filter circuits comprise a first filter circuit and a second filter circuit;
wherein the single integrated filter circuit die includes a first input port and a first output port for the first filter circuit and a second input port and a second output port for the second filter circuit;
wherein the first output port is connected to a first low noise amplifier (LNA) and the second output port is connected to a second LNA;
wherein the first input port is connected to a first antenna of the one or more first antennas and the second input port is connected to a second antenna of the one or more second antennas.

10. The RF module of claim 9, wherein the single integrated filter circuit die includes one or more common ground pads for the first filter circuit and the second filter circuit.

11. The RF module of claim 9, wherein the single integrated filter circuit die includes an independent pad for each of the first input port, the first output port, the second input port, and the second output port.

12. An electronic device comprising:
a radio frequency (RF) module comprising:
one or more first filter circuits of a bandwidth and one or more first amplifier circuits configured to implement a first function in a first geographic region by filtering and then amplifying or amplifying and then filtering a first signal communicated between one or more first antennas and a transceiver; and
one or more second filter circuits of the bandwidth and one or more second amplifier circuits configured to implement a second function in a second geographic region by filtering and then amplifying or amplifying and then filtering a second signal communicated between one or more second antennas and the transceiver;
wherein the one or more first filter circuits and the one or more second filter circuits are integrated on a single integrated filter circuit die and the RF module is configured to repurpose the one or more first filter circuits to implement an additional network function responsive to a signal, the signal generated responsive to a determination to operate the RF module for the second geographic region.

13. The electronic device of claim 12, wherein the additional network function is at least one of a multiple input multiple output (MIMO) function, a diversity function, and a dual connectivity (DC) function.

14. The electronic device of claim 12, wherein the RF module is configured repurpose the one or more first filter circuits to implement the additional network function in response to the RF module operating in a particular mode where the one or more first filter circuits are unused to implement the first function.

15. The electronic device of claim 12, wherein at least two like filter circuits of the one or more first filter circuits and the one or more second filter circuits are integrated onto the single integrated filter circuit die.

16. The electronic device of claim 15, wherein the at least two like filter circuits comprise a first filter circuit and a second filter circuit;
wherein the single integrated filter circuit die includes a first input port and a first output port for the first filter circuit and a second input port and a second output port for the second filter circuit;
wherein the first output port is connected to a first low noise amplifier (LNA) and the second output port is connected to a second LNA;
wherein the first input port is connected to a first antenna of the one or more first antennas and the second input port is connected to a second antenna of the one or more second antennas.

17. The electronic device of claim 15, wherein a plurality of resonators of a first filter circuit of the at least two like filter circuits and a second filter circuit of the at least two like filter circuits are tiled to increase a resonator area to die area ratio of the single integrated filter circuit die.

18. The electronic device of claim 17, wherein the at least two like filter circuits are filters of a predefined frequency range and are both receive filters or transmit filters.

19. The electronic device of claim 18, wherein the first filter circuit includes a first number of stages that implement filtering for the predefined frequency range and the second filter circuit includes a second number of stages that implement filtering for the predefined frequency range, wherein the first number of stages is different than the second number of stages.

20. A module comprising:
one or more first filter circuits of a bandwidth and one or more first amplifier circuits configured to implement a first function in a first geographic region by filtering and then amplifying or amplifying and then filtering a first signal communicated between one or more first antennas and a transceiver; and
one or more second filter circuits of the bandwidth and one or more second amplifier circuits configured to implement a second function in a second geographic region by filtering and then amplifying or amplifying and then filtering a second signal communicated between one or more second antennas and the transceiver;
wherein the one or more first filter circuits and the one or more second filter circuits are integrated on a single integrated filter circuit die and the module is configured to repurpose the one or more first filter circuits to implement an additional network function responsive to a signal, the signal generated responsive to a determination to operate the module for the second geographic region.

* * * * *